(12) United States Patent
Yang et al.

(10) Patent No.: US 10,536,142 B2
(45) Date of Patent: Jan. 14, 2020

(54) POWER ON RESET CIRCUIT

(71) Applicant: Xiamen Newyea Microelectronics Technology Co. Ltd., Xiamen, Fujian (CN)

(72) Inventors: Ruicong Yang, Xiamen (CN); Guijiang Lin, Xiamen (CN); Jianping Liao, Xiamen (CN); Fengbing Yang, Xiamen (CN); Lianfeng Ren, Xiamen (CN); Yushan Liu, Xiamen (CN); Binxu Shen, Xiamen (CN)

(73) Assignee: XIAMEN NEWYEA MICROELECTRONICS TECHNOLOGY CO. LTD., Xiamen, Fujian (CN)

( * ) Notice: Subject to any disclaimer, the term of this patent is extended or adjusted under 35 U.S.C. 154(b) by 0 days.

(21) Appl. No.: 16/003,754

(22) Filed: Jun. 8, 2018

(65) Prior Publication Data

US 2018/0294808 A1    Oct. 11, 2018

Related U.S. Application Data

(63) Continuation of application No. PCT/CN2016/112228, filed on Dec. 27, 2016.

(30) Foreign Application Priority Data

Apr. 8, 2016    (CN) .......................... 2016 1 0216863

(51) Int. Cl.
*H03L 5/00* (2006.01)
*H03K 17/22* (2006.01)

(52) U.S. Cl.
CPC ................. *H03K 17/223* (2013.01)

(58) Field of Classification Search
CPC ..................................................... H03K 17/223
(Continued)

(56) References Cited

U.S. PATENT DOCUMENTS

| 4,140,930 A | * | 2/1979 | Tanaka | G01R 19/16519 |
| | | | | 327/208 |
| 4,607,178 A | * | 8/1986 | Sugie | H03K 17/223 |
| | | | | 327/143 |

(Continued)

FOREIGN PATENT DOCUMENTS

| CN | 1705230 A | 12/2005 |
| CN | 101114827 A | 1/2008 |

(Continued)

*Primary Examiner* — Ryan Jager
(74) *Attorney, Agent, or Firm* — Muncy, Geissler, Olds & Lowe, P.C.

(57) ABSTRACT

A power on reset circuit includes a bias current generation module for generating a bias current, a power on reset module for generating a power on reset voltage signal, and a feedback latch module, which are electrically connected in sequence. The power on reset module includes two series switches capable of being turned on or off to adjust the bias current to further adjust the power on reset time. The feedback latch module is used for latching the power on reset voltage signal to restrain the jitter of the power voltage within the input voltage range $V_{IL}$-$V_{IH}$ of inverters in the power on stage and to avoid jump of the signal. The feedback latch module comprises a feedback branch, which is formed by two NMOS transistors in series connection and achieves rapider and stable output of the power on reset voltage signal through feedback of the signal.

6 Claims, 1 Drawing Sheet

(58) Field of Classification Search
USPC .................................................. 327/142, 143
See application file for complete search history.

(56) References Cited

U.S. PATENT DOCUMENTS

| | | | | |
|---|---|---|---|---|
| 5,030,845 | A * | 7/1991 | Love ..................... | H03K 17/223 327/143 |
| 5,243,233 | A * | 9/1993 | Cliff ..................... | H03K 17/223 327/143 |
| 5,825,220 | A * | 10/1998 | Kinugasa ......... | H03K 3/356008 327/143 |
| 5,864,247 | A * | 1/1999 | Hirano ............... | G01R 19/0084 327/143 |
| 6,144,237 | A * | 11/2000 | Ikezaki .................. | H03K 17/22 327/143 |
| 6,268,764 | B1 * | 7/2001 | Eagar ....................... | G05F 3/30 327/143 |
| 6,972,602 | B2 * | 12/2005 | Akamatsu ............ | H03K 17/223 327/143 |
| 7,161,396 | B1 * | 1/2007 | Zhou ..................... | H03K 17/223 327/143 |
| 7,348,816 | B2 * | 3/2008 | Shin ..................... | H03K 17/223 327/142 |
| 7,417,476 | B1 * | 8/2008 | Hung ................... | H03K 17/223 327/142 |
| 7,696,796 | B2 * | 4/2010 | Kwon .................... | H03K 17/22 327/143 |
| 8,193,841 | B2 * | 6/2012 | Sareen ................. | H03K 17/223 327/143 |
| 9,407,254 | B1 * | 8/2016 | De ....................... | H03K 17/223 |
| 2006/0087367 | A1 | 4/2006 | Inoue | |
| 2011/0156769 | A1 * | 6/2011 | Kang ..................... | H03K 17/22 327/143 |

FOREIGN PATENT DOCUMENTS

| | | |
|---|---|---|
| CN | 103997323 A | 8/2014 |
| CN | 204465489 U | 7/2015 |
| CN | 104935313 A | 9/2015 |
| CN | 105811941 A | 7/2016 |
| CN | 205490463 U | 8/2016 |

* cited by examiner

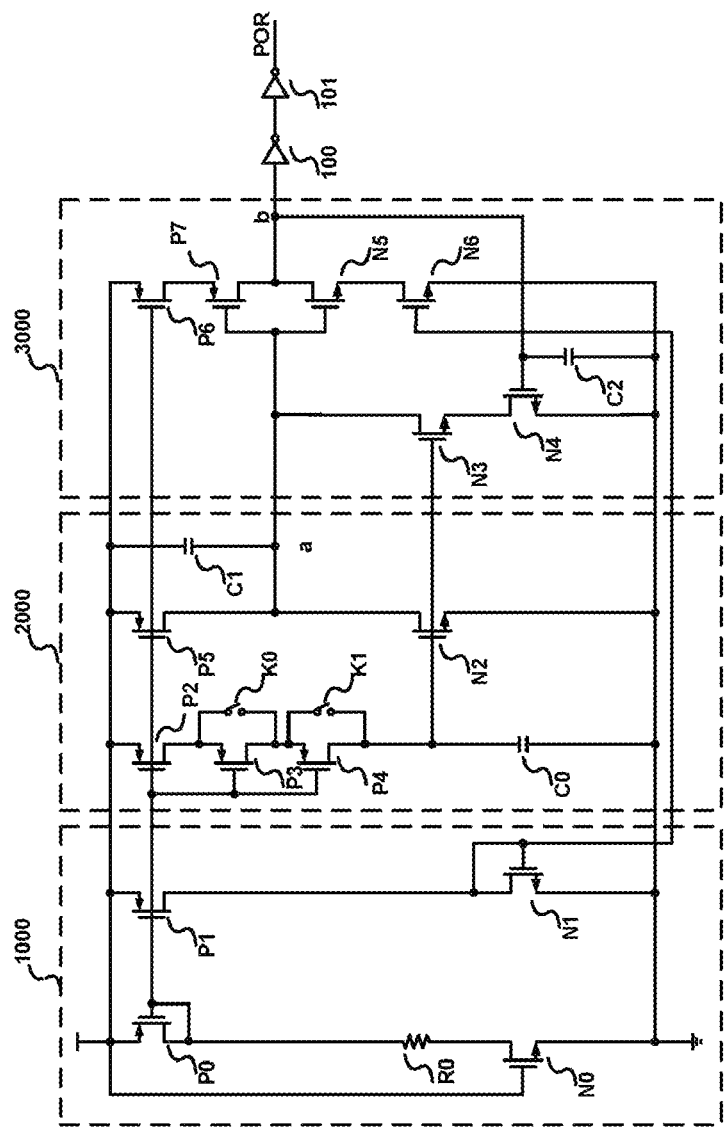

POWER ON RESET CIRCUIT

CROSS-REFERENCE TO RELATED APPLICATIONS

This application is a Bypass Continuation of International Application No. PCT/CN2016/112228, filed Dec. 27, 2016, which claims the benefit of Chinese Patent Application No. 201610216863.1, filed Apr. 8, 2016, all of which are hereby incorporated by reference as if fully set forth herein.

BACKGROUND OF THE INVENTION

Technical Field

The invention relates to the technical field of electronics, in particular to a power on reset circuit applied to wireless charging control chips.

Description of Related Art

Generally, in the power on initial stage of a circuit system, the power voltage has not reached an expected stable state yet, and consequentially, the voltage and logical state of many circuit devices (such as semiconductor devices) and circuit nodes are instable. To make sure that the circuit system always starts to operate in a state expected by designers after being powered on, in a period of time after a power supply is stabilized, a power on reset (POR) circuit can be used to generate a reset signal to make the circuit system in the initial state expected by the designers, and after the valid time of the reset signal, the circuit system starts to operate in the expected initial state. Namely, the power on reset circuit can reset other modules in the circuit system, thereby eliminating the instable state of the circuit modules in the power on initial stage.

Traditional power on reset circuits adopt PMOSs to charge capacitors, and the voltage of capacitor plates is slowly increased and is output after being shaped by several stages of inverters. However, by adoption of this circuit structure, if the power voltage jitters within the input voltage range $V_{IL}$-$V_{IH}$ of the inverters in the power on stage, the power on reset output signal will jump, which possibly results in abnormities of other circuit modules in the chip. In addition, in order to prolong the power on reset time, the width to length ratio of charging PMOS transistors of the circuits has to be decreased, or the area of the capacitors has to be increased, and consequentially, the area of the chip is increased, and the layout of the chip is changed. From the above description, the traditional power on reset circuits have the following disadvantages: Firstly, the power on reset output signal is instable and is likely to jump, which possibly results in abnormities of other circuit modules in the chip; and secondly, the power on reset time is difficult to adjust.

BRIEF SUMMARY OF THE INVENTION

Thus, to solve the problems mentioned above, the invention provides a power on reset circuit. According to the power on reset circuit, a power on reset module is provided with two series switches which can be turned on or off to adjust the charging current to further adjust the power on reset time, so that the area of a chip is prevented from being increased; a feedback latch module is adopted to latch a power on reset voltage signal generated by the power on reset module, so that the jitter of the power voltage within the input voltage range $V_{IL}$-$V_{IH}$ of inverters in the power on stage is effectively restrained, a stable power on reset signal is output, and jump of the power on reset voltage signal is avoided; and the feedback latch module is further provided with a feedback branch formed by two NMOS transistors in series connection, and the power on reset voltage signal can be fed back by turning on the feedback branch so as to be stably output more rapidly.

To solve the above technical problems, the following technical scheme is adopted by the invention:

A power on reset circuit comprises a bias current generation module, a power on reset module and a feedback latch module, which are electrically connected in sequence. The bias current generation module is used for generating a bias current. The power on reset module is used for generating a power on reset voltage signal and comprises two series switches which can be turned on or off to adjust the charging current generated by the bias current generation module to further adjust the power on reset time. The feedback latch module is used for latching the power on reset voltage signal generated by the power on reset module, so that the jitter of the power voltage within the input voltage range $V_{IL}$-$V_{IH}$ of inverters is restrained in the power on stage, and jump of the power on reset voltage output signal is avoided In order to output a stable power on reset signal and prevent the jitter of the power voltage within the input voltage range $V_{IL}$-$V_{IH}$ of the inverters in the power on stage, which may otherwise cause jump of the power on reset output signal and then possibly results in abnormities of other circuit modules in the chip, the feedback latch module is adopted by the invention to latch the power on reset voltage signal generated by the power on reset module in one preferred scheme, so that the jitter of the power voltage within the input voltage range $V_{IL}$-$V_{IH}$ of the inverters is effectively restrained in the power on stage, and jump of the power on reset voltage output signal is avoided. Furthermore, the feedback latch module of the invention is further provided with a feedback branch formed by two NMOS transistors in series connection, and the power on reset voltage signal can be fed back by turning on the feedback branch so as to be stably output more rapidly.

As a preferred embodiment, the feedback branch is formed by a $4^{th}$ NMOS transistor N3 and a $5^{th}$ NMOS transistor N4 in series connection.

As a preferred embodiment, the bias current generation module comprises a $1^{st}$ PMOS transistor P0, a $2^{nd}$ PMOS transistor P1, a $1^{st}$ NMOS transistor N0, a $2^{nd}$ NMOS transistor N1 and a resistor R0. The source of the $1^{st}$ PMOS transistor P0 is connected to the power voltage. The gate and the drain of the $1^{st}$ PMOS transistor P0 are connected. The gate of the $1^{st}$ PMOS transistor P0 is connected to the gate of the $2^{nd}$ PMOS transistor P1. The drain of the $1^{st}$ PMOS transistor P0 is connected to the input terminal of the resistor R0. The output terminal of the resistor R0 is connected to the drain of the $1^{st}$ NMOS transistor N0. The gate of the $1^{st}$ NMOS transistor N0 is connected to the power voltage. The source of the $1^{st}$ NMOS transistor N0 is grounded. The source of the $2^{nd}$ PMOS transistor P1 is connected to the power voltage. The gate of the $2^{nd}$ PMOS transistor P1 is connected to the gate of the $1^{st}$ PMOS transistor P0. The drain of the $2^{nd}$ PMOS transistor P1 is connected to the drain of the $2^{nd}$ NMOS transistor N1. The drain and the gate of the $2^{nd}$ NMOS transistor N1 are connected. The source of the $2^{nd}$ NMOS transistor N1 is grounded.

As a preferred embodiment, the power on reset module comprises a $3^{rd}$ PMOS transistor P2, a $4^{th}$ PMOS transistor P3, a $5^{th}$ PMOS transistor P4, a $6^{th}$ PMOS transistor P5, a $1^{st}$ switch K0, a $2^{nd}$ switch K1, a $3^{rd}$ NMOS transistor N2, a $1^{st}$ capacitor C0 and a $2^{nd}$ capacitor C1. The source of the $3^{rd}$ PMOS transistor P2 is connected to the power voltage. The gate of the $3^{rd}$ PMOS transistor P2 is connected to the gate of the 1st PMOS transistor P0, the gate of the 2nd PMOS transistor P1, the gate of the 4th PMOS transistor P3 and the gate of the 5th PMOS transistor P4. The drain of the 3rd PMOS transistor P2 is connected to the source of the 4th PMOS transistor P3. The drain and the source of the 4th PMOS transistor P3 are connected through the 1st switch K0. The drain of the 4th PMOS transistor P3 is connected to the source of the 5th PMOS transistor P4. The drain and the source of the 5th PMOS transistor P4 are connected through the 2nd switch K1. The drain of the 5th PMOS transistor P4 is connected to an upper plate electrode of the 1st capacitor C0 and the gate of the 3rd NMOS transistor N2. A lower plate electrode of the 1st capacitor C0 is grounded. The source of the 6th PMOS transistor P5 is connected to the power voltage. The gate of the 6th PMOS transistor P5 is connected to the gate of the 3rd PMOS transistor P2. The gate of the 1st PMOS transistor P0 is connected to the gate of the 2nd PMOS transistor P1. The drain of the 6th PMOS transistor P5 is connected to the drain of the 3rd NMOS transistor N2 and a lower plate electrode of the 2nd capacitor C1. The gate of the 3rd NMOS transistor N2 is connected to the drain of the 5th PMOS transistor P4 and an upper plate electrode of the 1st capacitor C0. The source of the 3rd NMOS transistor N2 is grounded. An upper plate electrode of the 2nd capacitor C1 is connected to the power voltage. A lower plate electrode of the 2nd capacitor C1 is connected to the drain of the 6th PMOS transistor P5 and the drain of the 3rd NMOS transistor N2.

As a preferred embodiment, the feedback latch module comprises a 7th PMOS transistor P6, an 8th PMOS transistor P7, a 4th NMOS transistor N3, a 5th NMOS transistor N4, a 6th NMOS transistor N5, a 7th NMOS transistor N6 and a 3rd capacitor C2. The source of the 7th PMOS transistor P6 is connected to the power voltage. The gate of the 7th PMOS transistor P6 is connected to the gate of the 1st PMOS transistor P0, the gate of the 2nd PMOS transistor P1, the gate of the 3rd PMOS transistor P2 and the gate of the 6th PMOS transistor P5. The drain of the 7th PMOS transistor P6 is connected to the source of the 8th PMOS transistor P7. The drain of the 8th PMOS transistor P7 is connected to the source of the 6th NMOS transistor N5. The gate of the 8th PMOS transistor P7 is connected to the gate of the 6th NMOS transistor N5, the drain of the 4th NMOS transistor N3, the lower plate electrode of the 2nd capacitor C1, the drain of the 6th PMOS transistor P5 and the drain of the 3rd NMOS transistor N2. The source of the 6th NMOS transistor N5 is connected to the drain of the 7th NMOS transistor N6. The gate of the 7th NMOS transistor N6 is connected to the gate and the drain of the 2nd NMOS transistor N1. The source of the 7th NMOS transistor N6 is grounded. The drain of the 4th NMOS transistor N3 is connected to the gate of the 8th PMOS transistor P7, the gate of the 6th NMOS transistor N5, the lower plate electrode of the 2nd capacitor C1, the drain of the 6th PMOS transistor P5 and the drain of the 3rd NMOS transistor N2. The gate of the 4th NMOS transistor N3 is connected to the gate of the 3rd NMOS transistor N2, the drain of the 5th PMOS transistor P4 and the upper plate electrode of the 1st capacitor C0. The source of the 4th NMOS transistor N3 is connected to the drain of the 5th NMOS transistor N4. The source of the 5th NMOS transistor N4 is grounded. The gate of the 5th NMOS transistor N4 is connected to an upper plate electrode of the 3rd capacitor C2, the drain of the 8th PMOS transistor P7, the drain of the 6th NMOS transistor N5 and the output terminal of the feedback latch module. A lower plate electrode of the 3rd capacitor C2 is grounded. The output terminal of the feedback latch module is connected to two series inverters and outputs a voltage POR.

As a preferred embodiment, the 1st PMOS transistor P0, the 2nd PMOS transistor P1, the 3rd PMOS transistor P2, the 4th PMOS transistor P3, the 5th PMOS transistor P4 and the 7th PMOS transistor P6 have the same width to length ratio, the width to length ratio of the 6th PMOS transistor P5 is greater than that of the 3rd PMOS transistor P2, the 2nd NMOS transistor N1 and the 7th NMOS transistor N6 have the same width to length ratio, the 3rd NMOS transistor N2, the 4th NMOS transistor N3 and the 5th NMOS transistor N4 have the same width to length ratio, the width to length ratio of the 5th NMOS transistor N4 is twice that of the 6th PMOS transistor P5, and if the width to length ratio of the $n^{th}$ PMOS transistor $P_{(n-1)}$ is set as $(W/L)_{P(n-1)}$ and the width to length ratio of the $n^{th}$ NMOS transistor $N_{(n-1)}$ is set as $(W/L)_{N(n-1)}$, the following formulas are met:

$(W/L)_{P0}=(W/L)_{P1}=(W/L)_{P2}=(W/L)_{P3}=(W/L)_{P4}=(W/L)_{P6}$, $(W/L)_{P5}>(W/L)_{P2}$, $(W/L)_{N1}=(W/L)_{N6}$, $(W/L)_{N2}=(W/L)_{N3}=(W/L)_{N4}>2*(W/L)_{P5}\circ$ As a preferred embodiment, the capacitance of the 1st capacitor C0 is greater than that of the 2nd capacitor C1, and the capacitance of the 2nd capacitor C1 is greater than that of the 3rd capacitor C2, namely, $C_0>C_1>C_2$.

By adoption of the above scheme, the power on reset module is provided with the two series switches which can be turned on or off to adjust the charging current to further adjust the power on reset time, so that the area of the chip is prevented from being increased, and the layout of the chip is prevented from being changed.

Compared with the prior art, the invention adopting the above scheme has the following advantages:

The power on reset module of the invention is provided with the two series switches which can be turned on or off to adjust the charging current to further adjust the power on reset time, so that the area of the chip is prevented from being increased, and the layout of the chip is prevented from being changed.

The feedback latch module is adopted by the invention to latch the power on reset voltage signal generated by the power on reset module, so that the jitter of the power voltage within the input voltage range $V_{IL}$-$V_{IH}$ of the inverters is effectively restrained in the power on stage, a stable power on reset signal is output, and jump of the power on reset voltage signal is avoided.

3. The feedback latch module of the invention is provided with the feedback branch formed by two NMOS transistors in series connection, and the power on reset voltage signal back can be fed back by turning on the feedback branch so as to be stably output more rapidly.

4. The technical scheme adopted by the invention is simple and extremely practical.

BRIEF DESCRIPTION OF THE SEVERAL VIEWS OF THE DRAWINGS

The sole FIGURE is a principle diagram of a power on reset circuit of the invention.

DETAILED DESCRIPTION OF THE INVENTION

The invention is further described in combination with the drawing and specific embodiment as follows.

As is shown in The sole FIGURE a power on reset circuit of the invention comprises a bias current generation module 1000, a power on reset module 2000 and a feedback latch module 3000, which are electrically connected in sequence. Wherein, the bias current generation module 1000 is used for generating a bias current; the power on reset module 2000 is used for generating a power on reset voltage signal and provided with two series switches which can be turned on or off to adjust the charging current to further adjust the power on reset time; the feedback latch module 3000 is used for latching the power on reset voltage signal generated by the power on reset module, so that the jitter of the power voltage within the input voltage range $V_{IL}$-$V_{IH}$ of inverters is effectively restrained in the power on stage, and jump of the power on reset voltage output signal is avoided; and the feedback latch module is further provided with a feedback branch formed by two NMOS transistors in series connection, and the power on reset voltage signal can be fed back by turning on the feedback branch so as to be stably output more rapidly. In this embodiment, the feedback branch is formed by a $4^{th}$ NMOS transistor N3 and a $5^{th}$ NMOS transistor N4 in series connection.

As a preferred embodiment, the bias current generation module comprises a $1^{st}$ PMOS transistor P0, a $2^{nd}$ PMOS transistor P1, a $1^{st}$ NMOS transistor N0, a $2^{nd}$ NMOS transistor N1 and a resistor R0. The source of the $1^{st}$ PMOS transistor P0 is connected to the power voltage. The gate and the drain of the $1^{st}$ PMOS transistor P0 are connected. The gate of the $1^{st}$ PMOS transistor P0 is connected to the gate of the $2^{nd}$ PMOS transistor P1. The drain of the $1^{st}$ PMOS transistor P0 is connected to the input terminal of the resistor R0. The output terminal of the resistor R0 is connected to the drain of the $1^{st}$ NMOS transistor N0. The gate of the $1^{st}$ NMOS transistor N0 is connected to the power voltage. The source of the $1^{st}$ NMOS transistor N0 is grounded. The source of the $2^{nd}$ PMOS transistor P1 is connected to the power voltage. The gate of the $2^{nd}$ PMOS transistor P1 is connected to the gate of the $1^{st}$ PMOS transistor P0. The drain of the $2^{nd}$ PMOS transistor P1 is connected to the drain of the $2^{nd}$ NMOS transistor N1. The drain of the $2^{nd}$ NMOS transistor N1 is connected to the gate. The source of the $2^{nd}$ NMOS transistor N1 is grounded.

The power on reset module comprises a $3^{rd}$ PMOS transistor P2, a $4^{th}$ PMOS transistor P3, a $5^{th}$ PMOS transistor P4, a $6^{th}$ PMOS transistor P5, a $1^{st}$ switch K0, a $2^{nd}$ switch K1, a $3^{rd}$ NMOS transistor N2, a $1^{st}$ capacitor C0 and a $2^{nd}$ capacitor C1. The source of the $3^{rd}$ PMOS transistor P2 is connected to the power voltage. The gate of the $3^{rd}$ PMOS transistor P2 is connected to the gate of the $1^{st}$ PMOS transistor P0, the gate of the $2^{nd}$ PMOS transistor P1, the gate of the $4^{th}$ PMOS transistor P3 and the gate of the $5^{th}$ PMOS transistor P4. The drain of the $3^{rd}$ PMOS transistor P2 is connected to the source of the $4^{th}$ PMOS transistor P3. The drain and the source of the $4^{th}$ PMOS transistor P3 are connected through the $1^{st}$ switch K0. The drain of the $4^{th}$ PMOS transistor P3 is connected to the source of the $5^{th}$ PMOS transistor P4. The drain and the source of the $5^{th}$ PMOS transistor P4 are connected through the $2^{nd}$ switch K1. The drain of the $5^{th}$ PMOS transistor P4 is connected to an upper plate electrode of the $1^{st}$ capacitor C0 and the gate of the $3^{rd}$ NMOS transistor N2. A lower plate electrode of the $1^{st}$ capacitor C0 is grounded. The source of the $6^{th}$ PMOS transistor P5 is connected to the power voltage. The gate of the $6^{th}$ PMOS transistor P5 is connected to the gate of the $3^{rd}$ PMOS transistor P2. The gate of the $1^{st}$ PMOS transistor P0 is connected to the gate of the $2^{nd}$ PMOS transistor P1. The drain of the $6^{th}$ PMOS transistor P5 is connected to the drain of the $3^{rd}$ NMOS transistor N2 and a lower plate electrode of the $2^{nd}$ capacitor. The gate of the $3^{rd}$ NMOS transistor N2 is connected to the drain of the $5^{th}$ PMOS transistor P4 and an upper plate electrode of the $1^{st}$ capacitor C0. The source of the $3^{rd}$ NMOS transistor N2 is grounded. An upper plate electrode of the $2^{nd}$ capacitor C1 is connected to the power voltage. A lower plate electrode of the $2^{nd}$ capacitor C1 is connected to the drain of the $6^{th}$ PMOS transistor P5 and the drain of the $3^{rd}$ NMOS transistor N2.

The feedback latch module comprises a $7^{th}$ PMOS transistor P6, an $8^{th}$ PMOS transistor P7, a $4^{th}$ NMOS transistor N3, a $5^{th}$ NMOS transistor N4, a $6^{th}$ NMOS transistor N5, a $7^{th}$ NMOS transistor N6 and a $3^{rd}$ capacitor C2. The source of the $7^{th}$ PMOS transistor P6 is connected to the power voltage. The gate of the $7^{th}$ PMOS transistor P6 is connected to the gate of the $1^{st}$ PMOS transistor P0, the gate of the $2^{nd}$ PMOS transistor P1, the gate of the $3^{rd}$ PMOS transistor P2 and the gate of the $6^{th}$ PMOS transistor P5. The drain of the $7^{th}$ PMOS transistor P6 is connected to the source of the $8^{th}$ PMOS transistor P7. The drain of the $8^{th}$ PMOS transistor P7 is connected to the source of the $6^{th}$ NMOS transistor N5, The gate of the $8^{th}$ PMOS transistor P7 is connected to the gate of the $6^{th}$ NMOS transistor N5, the drain of the $4^{th}$ NMOS transistor N3, the lower plate electrode of the $2^{nd}$ capacitor C1, the drain of the $6^{th}$ PMOS transistor P5 and the drain of the $3^{rd}$ NMOS transistor N2. The source of the $6^{th}$ NMOS transistor N5 is connected to the drain of the $7^{th}$ NMOS transistor N6. The gate of the $7^{th}$ NMOS transistor N6 is connected to the gate and the drain of the $2^{nd}$ NMOS transistor N1. The source of the $7^{th}$ NMOS transistor N6 is grounded. The drain of the $4^{th}$ NMOS transistor N3 is connected to the gate of the $8^{th}$ PMOS transistor P7, the gate of the $6^{th}$ NMOS transistor N5, the lower plate electrode of the $2^{nd}$ capacitor C1, the drain of the $6^{th}$ PMOS transistor P5 and the drain of the $3^{rd}$ NMOS transistor N2. The gate of the $4^{th}$ NMOS transistor N3 is connected to the gate of the $3^{rd}$ NMOS transistor N2, the drain of the $5^{th}$ PMOS transistor P4 and the upper plate electrode of the $1^{st}$ capacitor C0. The source of the $4^{th}$ NMOS transistor N3 is connected to the drain of the $5^{th}$ NMOS transistor N4. The source of the $5^{th}$ NMOS transistor N4 is grounded. The gate of the $5^{th}$ NMOS transistor N4 is connected to an upper plate electrode of the $3^{rd}$ capacitor C2, the drain of the $8^{th}$ PMOS transistor P7, the drain of the $6^{th}$ NMOS transistor N5 and the output terminal of the feedback latch module. A lower plate electrode of the $3^{rd}$ capacitor C2 is grounded. The output terminal of the feedback latch module is connected to two series inverters and outputs a voltage POR.

In order to output a stable power on reset signal and prevent the jitter of the power voltage within the input voltage range $V_{IL}$-$V_{IH}$ of the inverters in the power on stage, which may otherwise cause jump of the power on reset output signal and then possibly results in abnormities of other circuit modules in the chip, the feedback latch module is adopted by the invention to latch the power on reset voltage signal generated by the power on reset module, so that the jitter of the power voltage within the input voltage range $V_{IL}$-$V_{IH}$ of the inverters is effectively restrained in the power on stage, and jump of the power on reset voltage output signal is avoided. Furthermore, the feedback latch module of the invention is further provided with the feedback branch formed by two NMOS transistors in series connection, and the power on reset voltage signal can be fed back by turning on the feedback branch so as to be stably output more rapidly.

The specific operating process of the power on reset circuit of the invention is as follows:

As is shown in the sole FIGURE, after the bias current generation module 1000 is powered on by the power voltage, the $1^{st}$ NMOS transistor N0 is turned on, the $1^{st}$ PMOS transistor P0 is turned on, the $2^{nd}$ PMOS transistor P1, the $3^{rd}$ PMOS transistor P2, the $6^{th}$ PMOS transistor P5 and the $7^{th}$ PMOS transistor P6 are also turned on, the voltage of the upper plate electrode of the $1^{st}$ capacitor C0 is initialized to zero, the voltage of the upper plate electrode of the $3^{rd}$ capacitor C2 is also initialized zero.

Particularly, in order to achieve an excellent expected effect, the $1^{st}$ PMOS transistor P0, the $2^{nd}$ PMOS transistor P1, the $3^{rd}$ PMOS transistor P2, the $4^{th}$ PMOS transistor P3, the $5^{th}$ PMOS transistor P4 and the $7^{th}$ PMOS transistor P6 have the same width to length ratio, the width to length ratio of the $6^{th}$ PMOS transistor P5 is greater than that of the $3^{rd}$ PMOS transistor P2, the $2^{nd}$ NMOS transistor N1 and the $7^{th}$ NMOS transistor N6 have the same width to length ratio, the $3^{rd}$ NMOS transistor N2, the $4^{th}$ NMOS transistor N3 and the $5^{th}$ NMOS transistor N4 have the same width to length ratio, the width to length ratio of the $5^{th}$ NMOS transistor N4 is twice that of the $6^{th}$ PMOS transistor P5, and if the width to length ratio of the $n^{th}$ PMOS transistor $P_{(n-1)}$ is set as $(W/L)_{P(n-1)}$ and the width to length ratio of the $n^{th}$ NMOS transistor $N_{(n-1)}$ is set as $(W/L)_{N(n-1)}$, the following formulas are met:

$$(W/L)_{P0}=(W/L)_{P1}=(W/L)_{P2}=(W/L)_{P3}=(W/L)_{P4}=(W/L)_{P6},$$

$$(W/L)_{P5}>(W/L)_{P2},$$

$$(W/L)_{N1}=(W/L)_{N6},$$

$$(W/L)_{N2}=(W/L)_{N3}=(W/L)_{N4}>2*(W/L)_{P5}.$$

As a preferred embodiment, the capacitance of the $1^{st}$ capacitor C0 is greater than that of the $2^{nd}$ capacitor C1, and the capacitance of the $2^{nd}$ capacitor C1 is greater than that of the $3^{rd}$ capacitor C2, namely, $C_0 > C_1 > C_2$.

Assume that the $1^{st}$ switch K0 and the $2^{nd}$ switch K1 are turned off, as $(W/L)_{P5} > (W/L)_{P2}$, the charging current of the $6^{th}$ PMOS transistor P5 is greater than that of the $3^{rd}$ PMOS transistor P2, the capacitance of the $2^{nd}$ capacitor C1 is smaller than that of the $1^{st}$ capacitor C0, and thus, the voltage Va of the lower plate electrode of the $2^{nd}$ capacitor C1 (namely the input voltage of the inverters formed by the $6^{th}$ NMOS transistor N5, the $7^{th}$ NMOS transistor N6, the $7^{th}$ PMOS transistor P6 and the $8^{th}$ PMOS transistor P7) will reach a high level in a short time. Meanwhile, under the auxiliary voltage stabilization effect of the $3^{rd}$ capacitor C2, the output voltage Vb of the inverters formed by the $6^{th}$ NMOS transistor N5, the $7^{th}$ NMOS transistor N6, the $7^{th}$ PMOS transistor P6 and the $8^{th}$ PMOS transistor P7 is at a low level in the initial stage, the gate of the $5^{th}$ NMOS transistor N4 is at a low level, the $5^{th}$ NMOS transistor N4 is turned off, and at this moment, the POR circuit outputs a low level.

The $1^{st}$ capacitor C0 continues to be charged by the charging current across the $3^{rd}$ PMOS transistor P2, and when the voltage of the upper plate electrode of the $1^{st}$ capacitor C0 is greater than the turn-on threshold voltage $V_{THN}$ of the $3^{rd}$ NMOS transistor N2, the $3^{rd}$ NMOS transistor N2 is turned on, and then the voltage Va of the lower plate electrode of the $2^{nd}$ capacitor C1 is decreased gradually.

When Va is decreased to a low level, the output voltage Vb of the inverters formed by the $6^{th}$ NMOS transistor N5, the $7^{th}$ NMOS transistor N6, the $7^{th}$ PMOS transistor P6 and the $8^{th}$ PMOS transistor P7 reaches a high level, the gate of the $5^{th}$ NMOS transistor N4 is increased to a high level, the $5^{th}$ NMOS transistor N4 is turned on, and the branch of the $4^{th}$ NMOS transistor N3 and the $5^{th}$ NMOS transistor N4 is turned on, namely the feedback branch is turned on, so that the voltage Va of the lower plate electrode of the $2^{nd}$ capacitor C1 is further decreased more rapidly, and the power on reset voltage signal is stably output more rapidly. At this moment, feedback latch is realized by the inverters formed by the $6^{th}$ NMOS transistor N5, the $7^{th}$ NMOS transistor N6, the $7^{th}$ PMOS transistor P6 and the $8^{th}$ PMOS transistor P7 as well as the $4^{th}$ NMOS transistor N3 and the $5^{th}$ NMOS transistor N4, so that the jitter of the power voltage within the input voltage range $V_{IL}$-$V_{IH}$ of the inverters is effectively restrained in the power on stage, jump of the power on reset voltage output signal is avoided, a high level is output by the POR circuit stably and rapidly, and then the power on reset process is completed.

In the prior art, in order to adjust the power on reset time more conveniently, for instance in order to prolong the power on reset time, the width to length ratio of charging PMOSs has to be decreased, or the area of capacitors has to be increased, and consequentially, the area of a chip is increased to a certain extent, and the layout of the chip is changed. As for the invention, the power on reset module is provided with the two series switches which can be turned on or off to adjust the charging current to further adjust the power on reset time, so that the area of the chip is prevented from being increased, and the layout of the chip is prevented from being changed.

Specifically, as is shown in the sole FIGURE, in the power on reset module 2000, the $1^{st}$ switch K0 is arranged at the joint of the drain and the source of the $4^{th}$ PMOS transistor P3, and the $2^{nd}$ switch K1 is arranged at the joint of the drain and the source of the $5^{th}$ PMOS transistor P4.

Assume that the charging current of the $3^{rd}$ PMOS transistor P2 to the $1^{st}$ capacitor C0 is I when the $1^{st}$ switch K0 and the $2^{nd}$ switch K1 are both turned off, the low-level width of the power on reset signal is T.

When the $1^{st}$ switch K0 is turned on and the $2^{nd}$ switch K1 is turned off or the $1^{st}$ switch K0 is turned off and the $2^{nd}$ switch K1 is turned on, the equivalent width to length ratio (W/L) of PMOSs on the branch of the $3^{rd}$ PMOS transistor P2 turns to half of the width to length ratio when the $1^{st}$ switch K0 and the $2^{nd}$ switch K1 are both turned off, and the charging current of the $3^{rd}$ PMOS transistor P2 to the $1^{st}$ capacitor C0 turns to (I/2), and the low-level width of the power on reset signal turns to 2T.

When the $1^{st}$ switch K0 and the $2^{nd}$ switch K1 are both turned off, the equivalent width to length ratio (W/L) of the PMOSs on the branch of the $3^{rd}$ PMOS transistor P2 turns to one third of the width to length ratio when the $1^{st}$ switch K0 and the $2^{nd}$ switch K1 are both turned off, the charging current of the $3^{rd}$ PMOS transistor P2 to the $1^{st}$ capacitor C0 turns to (I/3), and the low-level width of the power on reset signal turns to 3T.

Therefore, the power on reset time can be adjusted by adjusting the $1^{st}$ switch K0 and the $2^{nd}$ switch K1 without increasing the area of the chip or changing the layout of the chip.

In addition, as for the power on reset circuit of the invention, PMOSs on the branch of the $3^{rd}$ PMOS transistor P2 and the number of corresponding switches in the power on reset module 2000 can be designed according to requirements. Assume that the number is n, the n switches can be turned on or off to adjust the equivalent width to length ratio (W/L) of the PMOSs on the branch of the $3^{rd}$ PMOS transistor P2 to further adjust the charging current of the branch of the $3^{rd}$ PMOS transistor P2, the power on reset low-level width can reach nT (n is a positive integer greater than 0), and thus the power on reset time is adjusted without increasing the area of the chip or changing the layout of the chip.

Although the invention is specifically illustrated and introduced in combination with the preferred embodiment, those skilled in the field would appreciate that various changes of the invention can be made in form and in detail without deviating from the spirit and scope set form by the claims and all these changes should fall within the protection scope of the invention.

What is claimed is:

1. A power on reset circuit, comprising a bias current generation module, a power on reset module and a feedback latch module, which are electrically connected in sequence, wherein, the bias current generation module is used for generating a bias current;

the power on reset module is connected to the bias current generation module and used for generating a power on reset voltage signal and comprises a capacitor, a plurality of transistors connected to the plurality of transistors, and two series switches capable of being turned on or off to adjust a charging current of the plurality of transistors for charging the capacitor to further adjust a power on reset time; and the feedback latch module comprises inverters connected to the power on reset module and is used for latching the power on reset voltage signal generated by the power on reset module, so that jitter of a power voltage within an input voltage range $V_{IL}$-$V_{IH}$ of the inverters in a power on stage is restrained, and jump of the power on reset voltage signal is avoided, and the bias current generation module comprises a $1^{st}$ PMOS transistor P0, a $2^{nd}$ PMOS transistor P1, a $1^{st}$ NMOS transistor N0, a $2^{nd}$ NMOS transistor N1 and a resistor R0, wherein a source of the $1^{st}$ PMOS transistor P0 is connected to the power voltage a gate and a drain of the $1^{st}$ PMOS transistor P0 are connected, the gate of the $1^{st}$ PMOS transistor P0 is connected to a gate of the $2^{nd}$ PMOS transistor P1, the drain of the $1^{st}$ PMOS transistor P0 is connected to an input terminal of the resistor R0, an output terminal of the resistor R0 is connected to a drain of the $1^{st}$ NMOS transistor N0, a gate of the $1^{st}$ NMOS transistor N0 is connected to the power voltage, a source of the $1^{st}$ NMOS transistor N0 is grounded, a source of the $2^{nd}$ PMOS transistor P1 is connected to the power voltage, a gate of the $2^{nd}$ PMOS transistor P1 is connected to the gate of the $1^{st}$ PMOS transistor P0, a drain of the $2^{nd}$ PMOS transistor P1 is connected to a drain of the $2^{nd}$ NMOS transistor N1, the drain of the $2^{nd}$ NMOS transistor and a gate of the $2^{nd}$ NMOS transistor N1 are connected, and a source of the $2^{nd}$ NMOS transistor N1 is grounded.

2. The power on reset circuit according to claim 1, wherein the feedback latch module further comprises a feedback branch formed by two NMOS transistors in series connection that are respectively connected to an input and an output of the inverters.

3. The power on reset circuit according to claim 1, wherein the power on reset module comprises a $3^{rd}$ PMOS transistor P2, a $4^{th}$ PMOS transistor P3, a $5^{th}$ PMOS transistor P4, a $6^{th}$ PMOS transistor P5, a $1^{st}$ switch K0, a $2^{nd}$ switch K1, a $3^{rd}$ NMOS transistor N2, a $1^{st}$ capacitor C0 and a $2^{nd}$ capacitor C1, wherein a source of the $3^{rd}$ PMOS transistor P2 is connected to the power voltage, a gate of the $3^{rd}$ PMOS transistor P2 is connected to the gate of the $1^{st}$ PMOS transistor P0, the gate of the $2^{nd}$ PMOS transistor P1, a gate of the $4^{th}$ PMOS transistor P3 and a gate of the $5^{th}$ PMOS transistor P4, the drain of the $3^{rd}$ PMOS transistor P2 is connected to the source of the $4^{th}$ PMOS transistor P3, a drain and a source of the $4^{th}$ PMOS transistor P3 are connected through the $1^{st}$ switch, the drain of the $4^{th}$ PMOS transistor P3 is connected to a source of the $5^{th}$ PMOS transistor P4, a drain of the $5^{th}$ PMOS transistor and the source of the $5^{th}$ PMOS transistor P4 are connected through the $2^{nd}$ switch K1, the drain of the $5^{th}$ PMOS transistor P4 is connected to an upper plate electrode of the $1^{st}$ capacitor C0 and a gate of the $3^{rd}$ NMOS transistor N2, a lower plate electrode of the $1^{st}$ capacitor C0 is grounded, a source of the $6^{th}$ PMOS transistor P5 is connected to the power voltage, a gate of the $6^{th}$ PMOS transistor P5 is connected to the gate of the $3^{rd}$ PMOS transistor P2, the gate of the $1^{st}$ PMOS transistor P0 is connected to the gate of the $2^{nd}$ PMOS transistor P1, a drain of the $6^{th}$ PMOS transistor P5 is connected to a drain of the $3^{rd}$ NMOS transistor N2 and a lower plate electrode of the $2^{nd}$ capacitor, the gate of the $3^{rd}$ NMOS transistor N2 is connected to the drain of the $5^{th}$ PMOS transistor P4 and an upper plate electrode of the $1^{st}$ capacitor C0, the source of the $3^{rd}$ NMOS transistor N2 is grounded, an upper plate electrode of the $2^{nd}$ capacitor C1 is connected to the power voltage, and a lower plate electrode of the $2^{nd}$ capacitor C1 is connected to the drain of the $6^{th}$ PMOS transistor P5 and the drain of the $3^{rd}$ NMOS transistor N2.

4. The power on reset circuit according to claim 3, wherein the feedback latch module comprises a $7^{th}$ PMOS transistor P6, an $8^{th}$ PMOS transistor P7, a $4^{th}$ NMOS transistor N3, a $5^{th}$ NMOS transistor N4, a $6^{th}$ NMOS transistor N5, a $7^{th}$ NMOS transistor N6 and a $3^{rd}$ capacitor C2, wherein a source of the $7^{th}$ PMOS transistor P6 is connected to the power voltage, a gate of the $7^{th}$ PMOS transistor P6 is connected to the gate of the $1^{st}$ PMOS transistor P0, the gate of the $2^{nd}$ PMOS transistor P1, the gate of the $3^{rd}$ PMOS transistor P2 and the gate of the $6^{th}$ PMOS transistor P5, a drain of the $7^{th}$ PMOS transistor P6 is connected to a source of the $8^{th}$ PMOS transistor P7, a drain of the $8^{th}$ PMOS transistor P7 is connected to a source of the $6^{th}$ NMOS transistor N5, a gate of the $8^{th}$ PMOS transistor P7 is connected to a gate of the $6^{th}$ NMOS transistor N5, a drain of the $4^{th}$ NMOS transistor N3, the lower plate electrode of the $2^{nd}$ capacitor C1, the drain of the $6^{th}$ PMOS transistor P5 and the drain of the $3^{rd}$ NMOS transistor N2, a source of the $6^{th}$ NMOS transistor N5 is connected to a drain of the $7^{th}$ NMOS transistor N6, a gate of the $7^{th}$ NMOS transistor N6 is connected to the gate and the drain of the $2^{nd}$ NMOS transistor N1, a source of the $7^{th}$ NMOS transistor N6 is grounded, the drain of the $4^{th}$ NMOS transistor N3 is connected to the gate of the $8^{th}$ PMOS transistor P7, the gate of the $6^{th}$ NMOS transistor N5, the lower plate electrode of the $2^{nd}$ capacitor C1, the drain of the $6^{th}$ PMOS transistor P5 and the drain of the $3^{rd}$ NMOS transistor N2, a gate of the $4^{th}$ NMOS transistor N3 is connected to a gate of the $3^{rd}$ NMOS transistor N2, the drain of the $5^{th}$ PMOS transistor P4 is connected to the upper plate electrode of the $1^{st}$ capacitor C0, a source of the $4^{th}$ NMOS transistor N3 is connected to a drain of the $5^{th}$ NMOS transistor N4, a source of the $5^{th}$ NMOS transistor N4 is grounded, a gate of the $5^{th}$ NMOS transistor N4 is connected to an upper plate electrode of the $3^{rd}$ capacitor C2, the drain of the $8^{th}$ PMOS transistor P7, the drain of the $6^{th}$ NMOS transistor N5 and an output terminal of the feedback latch module, a lower plate electrode of the $3^{rd}$ capacitor C2 is grounded, and the output terminal of the feedback latch module is connected to the two series inverters and outputs a voltage POR.

5. The power on reset circuit according to claim 4, wherein the 1$^{st}$ PMOS transistor P0, the 2$^{nd}$ PMOS transistor P1, the 3$^{rd}$ PMOS transistor P2, the 4$^{th}$ PMOS transistor P3, the 5$^{th}$ PMOS transistor P4 and the 7$^{th}$ PMOS transistor P6 have a same width to length ratio, a width to length ratio of the 6$^{th}$ PMOS transistor P5 is greater than the width to length ratio of the 3$^{rd}$ PMOS transistor P2, the 2$^{nd}$ NMOS transistor N1 and the 7$^{th}$ NMOS transistor N6 have a same width to length ratio, the 3$^{rd}$ NMOS transistor N2, the 4$^{th}$ NMOS transistor N3 and the 5$^{th}$ NMOS transistor N4 have a same width to length ratio, the width to length ratio of the 5$^{th}$ NMOS transistor N4 is twice the width to length ratio of the 6$^{th}$ PMOS transistor P5, and if a width to length ratio of a n$^{th}$ PMOS transistor P$_{(n-1)}$ is set as $(W/L)_{P_{(n-1)}}$ and a width to length ratio of a n$^{th}$ NMOS transistor N$_{(n-1)}$ is set as $(W/L)_{N_{(n-1)}}$, formulas as follows are met:

$(W/L)_{P0}=(W/L)_{P1}=(W/L)_{P2}=(W/L)_{P3}=(W/L)_{P4}=(W/L)_{P6}$, $(W/L)_{P5}>(W/L)_{P2}$, $(W/L)_{N1}=(W/L)_{N6}$, $(W/L)_{N2}=(W/L)_{N3}=(W/L)_{N4}>2*(W/L)_{P5}$.

6. The power on reset circuit according to claim 4, wherein a capacitance of the 1$^{st}$ capacitor C0 is greater than a capacitance of the 2$^{nd}$ capacitor C1, and the capacitance of the 2$^{nd}$ capacitor C1 is greater than a capacitance of the 3$^{rd}$ capacitor C2, namely, $C_0>C_1>C_2$.

* * * * *